United States Patent [19]

Kishimoto et al.

[11] 4,395,704
[45] Jul. 26, 1983

[54] INPUT DEVICE FOR ELECTRONIC APPARATUS

[75] Inventors: Juji Kishimoto; Ichiro Sado, both of Tokyo; Mitsuo Cho, Ina, all of Japan

[73] Assignee: Canon Kabushiki Kaisha, Tokyo, Japan

[21] Appl. No.: 304,311

[22] Filed: Sep. 21, 1981

Related U.S. Application Data

[63] Continuation of Ser. No. 82,536, Oct. 9, 1979, abandoned.

[30] Foreign Application Priority Data

Oct. 14, 1978 [JP] Japan .................................. 53-125716

[51] Int. Cl.³ ........................ G08C 9/00; G06F 13/00
[52] U.S. Cl. ............................ 340/365 S; 340/365 R; 364/709

[58] Field of Search .................. 340/365 S, 365 R; 364/709, 710, 705, 708; 179/90 K; 178/17 C

[56] References Cited

U.S. PATENT DOCUMENTS

| | | | |
|---|---|---|---|
| 3,940,758 | 2/1976 | Margolin | 364/708 |
| 4,099,246 | 7/1978 | Osborne et al. | 340/365 R |
| 4,117,542 | 9/1978 | Klausner et al. | 364/709 |
| 4,120,036 | 10/1978 | Maeda et al. | 364/705 |
| 4,122,526 | 10/1978 | Dlugos et al. | 364/705 |

*Primary Examiner*—Donnie L. Crosland
*Attorney, Agent, or Firm*—Fitzpatrick, Cella, Harper & Scinto

[57] ABSTRACT

An input device for electronic apparatus includes key signal output lines each having plural key switches connected thereto and circuitry for separating the key signals into specific key signals thereby identifying the plural key switches.

2 Claims, 5 Drawing Figures

INPUT DEVICE FOR ELECTRONIC APPARATUS

This is a continuation, of application Ser. No. 82,536, filed Oct. 9, 1979, now abandoned.

BACKGROUND OF THE INVENTION

This invention relates to an input device of electronic apparatus.

The recent advancement in the performance of electronic apparatus such as electronic calculators brought about by the progress of the large-scale integrated circuits is resulting in the increase in number of the key switches constituting a part of the input device. Therefore, for example in calculators capable of functional calculations, a compact structure is generally achieved by the use of double- or triple-function keys wherein each key performs plural functions by combinations with other keys.

Also the increase in number of keys leads to the increase in number of input/output ports of the large-scale integrated circuit, and the use of the above-mentioned double- or triple-function keys has been an effective measure for preventing such increase. However, multiple functions represented by a single key are difficult to learn for the users and inevitably lead to complicated and easily mistakable operations.

SUMMARY OF THE INVENTION

An object of the present invention is to provide electronic apparatus equipped with a key input device wherein each key represents a single function thus allowing an easy use without significant increase in the number of input-output ports of the large-scale integrated circuit. For example in scientific functional calculations each key is alloted a function so as to obtain the answer with one operation.

The conventional scientific functional calculator generally has a key arrangement as shown in FIG. 1 wherein each of the keys for scientific functional calculations is alloted two or more functions. For this reason, in order to calculate for example the expression of $10^2$ in the calculator shown in FIG. 1, there is required two function key actuations [F] and [$10^x$/log], following the actuation of a number key [2].

The use of such double-function keys each representing two functions is a measure for preventing the increase of electric connections to the arithmetic control unit resulting from the increase in the total number of keys and also for preventing the use of excessively small keys which will be inevitable in case a reasonably portable structure is required with an increased number of keys. Such arrangement is however associated with a draw-back of requiring two function key actuations for a single functional calculation.

Another object of the present invention is to provide a calculator capable of performing functional calculations without the above-explained drawback and still without sacrificing the portability of the calculator.

The present invention will be clarified in detail by the following description to be taken in conjunction with the attached drawings.

DESCRIPTION OF THE PREFERRED EMBODIMENTS

Figure 1:
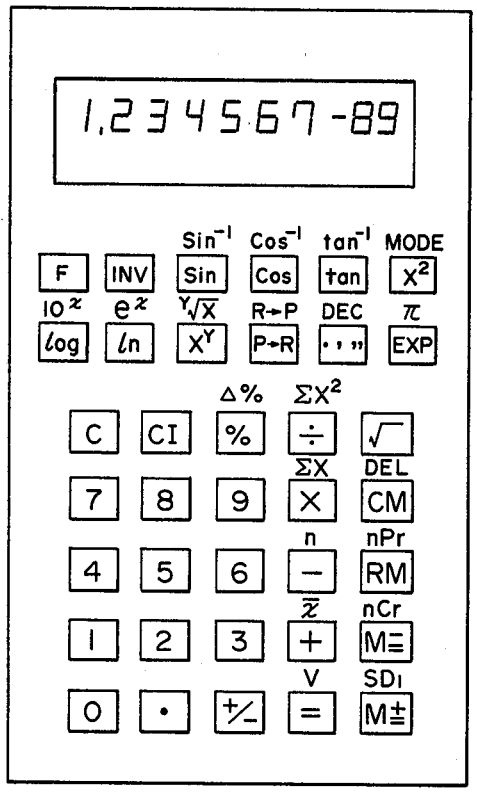
FIG. 1 is a view showing a key arrangement in a conventional functional calculator.
Figure 2:
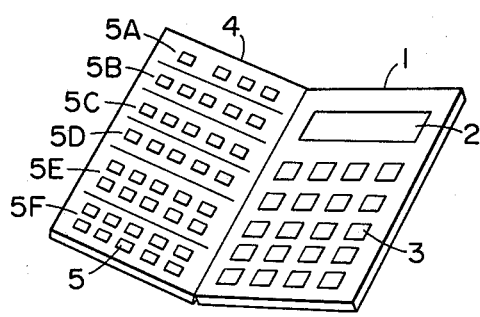
FIG. 2 is an external view of a functional calculator embodying the present invention.

In FIG. 2 there is shown, in an external view, an example of the calculator embodying the present invention which is realized in a thin foldable structure and is provided on the right-hand keyboard 1 with a display unit 2 comprising numerical display elements 2A and a key group 3 for number input and arithmetic calculations, and on the left-hand side keyboard 4 with a key group 5 for scientific and/or statistical calculations. Keyboards 1 and 4 are preferably rendered foldable at the connection therebetween whereby the number of keys can be increased without sacrificing the portability of the calculator.

Figure 3:
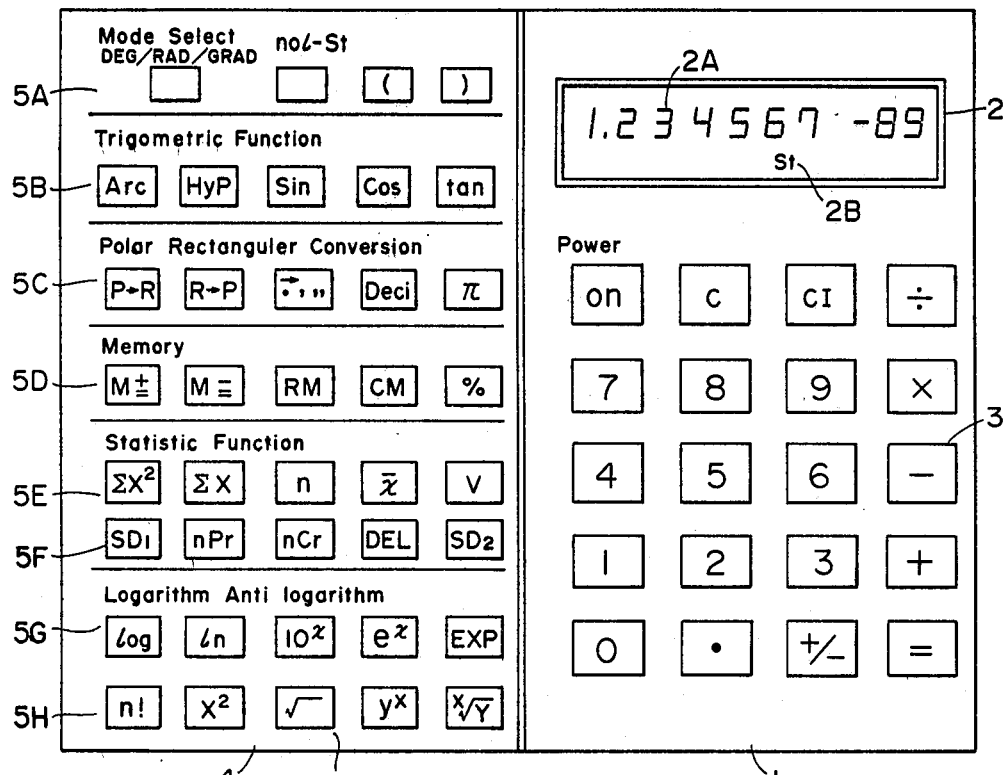
FIG. 3 is a view showing the key arrangement in the calculator shown in FIG. 2.

FIG. 3 shows a detailed example of key groups 3 and 5 on the keyboards 1 and 4. On the keyboard 1 there are provided a display unit 2 in the upper portion, and therebelow a power switch [on], a clear key group [C] and [CI], an arithmetic key group [+], [×], [−], [÷] and [=], a sign conversion key group [+/−] and a number key group [0], [1]−[9] and [.], so that the arithmetic calculation can be performed by the abovementioned key groups on the right-hand side keyboard 1 in the case that scientific functions are not needed.

The keyboard 4 is for example divided into six functional sections of a mode selecting key group 5A, a trigometric key group 5B, a function conversion key group 5C, a memory key group 5D, statistic function key groups 5E and 5F a logarithmic function key groups 5G and 5H. The mode selecting key group 5A is provided with a key [DEG/RAD/GRAD] for the conversion of degree-radian-gradient and keys [nol→st], [(] and [)]. The trigometric key group 5B is provided with keys [Arc], [Hyp], [sin], [cos] and [tan]. These keys may be substituted by the following group of keys [sin], [cos], [tan], [Arc sin], [Arc cos], [Arc tan], [Hyp sin], [Hyp cos], [Hyp tan], [Arc Hyp sin], [Arc Hyp cos] and [Arc Hyp tan]. The above-mentioned 5-key arrangement is preferable since the alternative independent key arrangement involves an excessively large number of keys and is rather unnatural since the trigometric functions, inverse trigonometric functions, hyperbolic functions and inverse hyperbolic functions are commonly represented for example by "sin", "arc sin", "hyp sin" and "arc hyp sin".

The function conversion key group 5C is provided with keys [P→R] and [R→P] for polar-rectangular coordinate conversion, an angle conversion key [° ′ ″], a decimal conversion key [Deci] and a key [$\pi$]. The logarithmic function key groups 5G and 5H is provided with an ordinary logarithm key [log], a natural logarithm key [ln], an ordinary exponential key [$10^x$], a natural exponential key [$e^x$] and other keys [Exp], [n!], [$X^2$], [$\sqrt{\ }$], [$Y^x$] and [$^x\sqrt{\ }$]. The statistic function key groups 5E and 5F are provided with keys [$\Sigma X^2$], [$\Sigma X$], [n], [$\bar{x}$], [V], [SD$_1$], [nPr], [nCr], [DEL] and [SD$_2$]. Also the memory function key group 5D is provided with keys [M±], [M=], [RM], [CM] and [%].

It is to be noted that the above-mentioned scientific function keys are merely an example of the present invention and may be modified arbitrarily to any combination within the range of the present invention.

Figure 4:
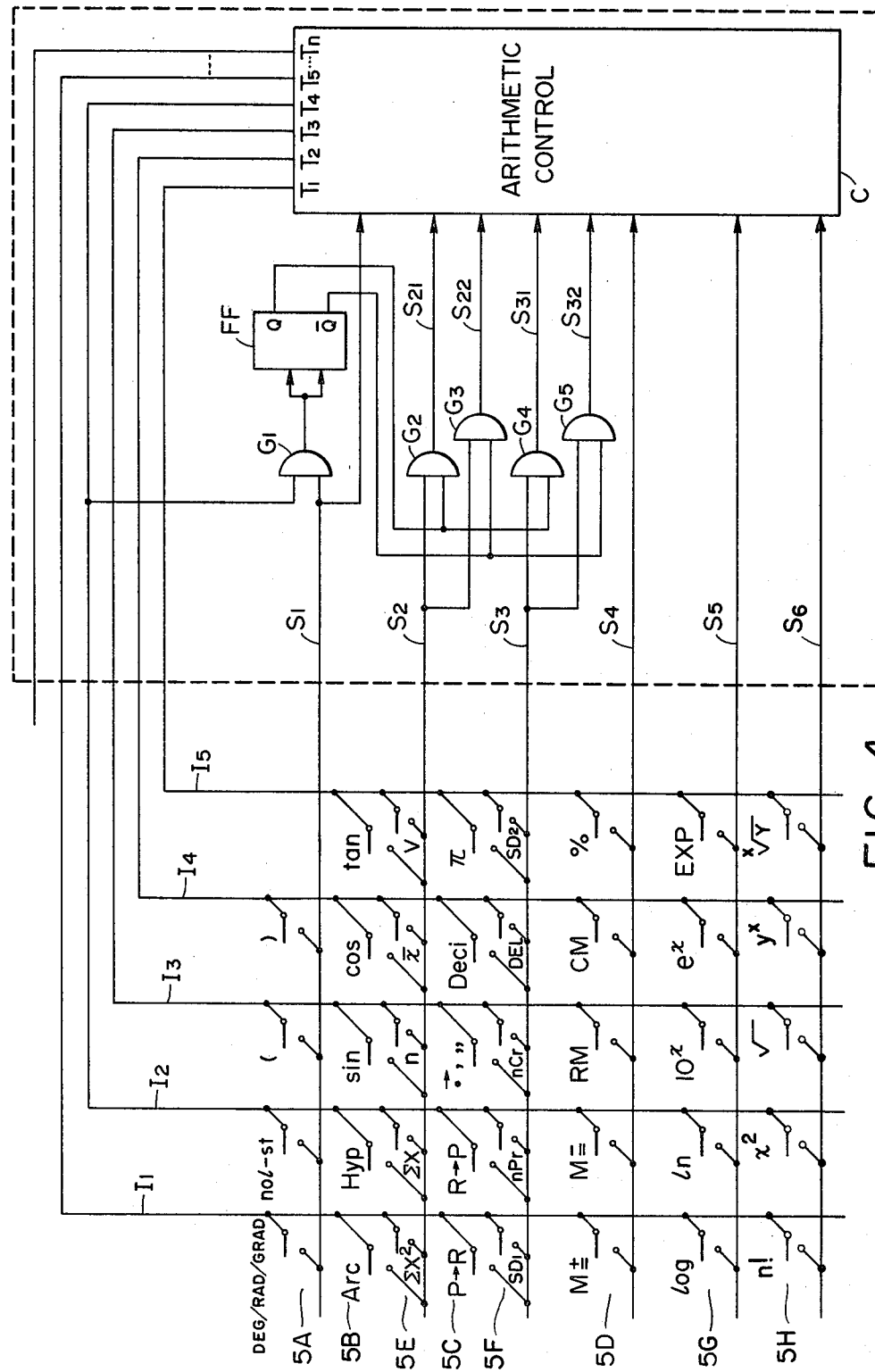
FIG. 4 is a schematic circuit diagram showing a part of key connections in the calculator of the present invention and also showing an example of internal processing in the arithmetic control.

FIG. 4 shows an example of the wiring for the key groups 5a to 5H shown in FIG. 3. The calculator shown in FIG. 3 has approximately 60 keys in total, and it will be understood that, in order to obtain (m×n) crossing points in an ordinary key matrix there will be required (m+n) connections to the arithmetic control unit. In the present embodiment, however, on the supposition that the trigometric function key group 5B and function conversion key group 5C are not used during statistical calculations by the key groups 5E and 5F, these key groups are connected in parallel to the crossing points of the key matrix as shown in FIG. 4 in the order corresponding to the key arrangement shown in FIG. 3, wherein either the trigometric function key group 5B and function conversion key group 5C or the statistic function key groups 5E or 5F can be alternatively selected by the mode selecting key [nol−st]. The key signals obtained from these key groups through output signal lines S2 and S3 are identified as the signals of originating key group by means of a gate circuit to be explained later and are supplied to a conventional arithmetic control C.

Figure 5:
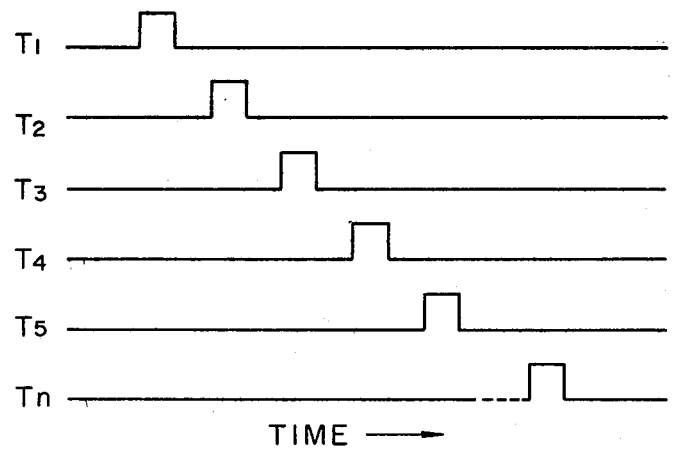
FIG. 5 is a wave-form chart of timing signals T1 to Tn shown in FIG. 4.

In FIG. 4, arithmetic control C supplies timing signals T1, T2, ..., Tn as shown in FIG. 5 for selecting either one of plural keys to input signals lines I1, I2, ..., In (FIG. 4 shows only I1 to I5 for the purpose of clarity). The mode selecting key (nol−st] is connected between the input signal line I2 and the output signal line S1 which are also connected to an AND gate G1 of which AND output is supplied to a flip-flop FF, whereby key group selecting output signals are alternately obtained from the output terminals Q and $\overline{Q}$ of flip-flop FF in response to the on- and off-states of mode selecting key [nol−st]. Output terminal Q and the signal line S2 are connected to an AND gate G2; output terminal $\overline{Q}$ and signal line S2 are connected to an AND gate G3; the output terminal Q and the signal line S3 are connected to an AND gate G4; and the output terminal $\overline{Q}$ and signal line S3 are connected to an AND gate G5. The output signal lines S21, S22, S31 and S32 from AND gates G2 to G5 and other output signal lines S1, S4, ..., Sn (S1 and S4 in FIG. 4) are connected in the conventional manner to the arithmetic control C. In the case that the output Q of the flip-flop FF is alloted to the statistic functions and the output $\overline{Q}$ to the trigometric functions and function conversion, the key signals from the statistic function key group 5E can be obtained from the output signal lines S21 and S31 while those from the trigometric function key group 5B and the function conversion key group 5C can be obtained from the output signal lines S22 and S32. Naturally the above-mentioned allotment may be inverted if desired. In the above-explained manner it is rendered possible to significantly reduce the number (m+n) of the input/output ports by the use of a gate circuit as explained in the foregoing.

The above-mentioned key [nol−st] is a self-returning or non-lock key similar to other keys and is designed, upon actuation, to shift the calculator to the statistic mode wherein the key group 5E is active and a display "st" is indicated in a portion 2B of the display unit 2. Upon repeated actuation the flip-flop FF is inverted to shift the calculator to another mode wherein the trigometric function key group 5B and the function conversion key group 5C are active and the display is changed to "nol". Upon further repeated actuation of the key the calculator is again shifted to the mode "st". A similar structure will be employed for other keys such as [DEG/RAD/GRAD].

As explained in the foregoing, the present invention provides convenience for use since a large number of function keys can be arranged without reducing the key dimension and without sacrificing the portability and also since a desired functional calculation can be achieved with a single key operation. Also the present invention facilitates the understanding of the user as the keys are grouped in position according to the functions thereof.

Although in the foregoing embodiment the scientific function keys are separated from other function keys, it is also possible to separate the arithmetic function keys from other function keys thereby providing a calculator easily usable and still satisfactorily portable to the user. Also it will be apparent that the use of a gate as shown in FIG. 4 allows to prevent a significant increase in the number of input/output ports of the arithmetic control.

We claim:

1. An input device for electronic apparatus comprising:

a first plurality of spaced keys each for producing a signal;

a first key signal line to which each of said first keys is coupled for conducting a signal therefrom;

a plurality of first AND gate means each of which is coupled to said first key signal line; and setting means for selecting any one of said plurality of said first AND gate means to transmit signals produced by only a portion of said keys, said setting means including memory means, a manual switch, a second key signal line, and second AND gate means for changing the output status of said memory means to select a different one of said first AND gate means to transmit signals produced by a different portion of said keys, an output of said second AND gate means being coupled to the input of said memory means, and an input of said second AND gate means being coupled to said manual switch by said second key signal line.

2. An input device for electronic apparatus according to claim 1, further including means which enable said device to be folded.

* * * * *